United States Patent
Rizza

(10) Patent No.: US 9,459,288 B2
(45) Date of Patent: Oct. 4, 2016

(54) WIDE INTERPOSER FOR AN ELECTRONIC TESTING SYSTEM

(71) Applicant: Infineon Technologies AG, Neubiberg (DE)

(72) Inventor: Rianda Rizza, Batam Island (ID)

(73) Assignee: Infineon Technologies AG, Neubiberg (DE)

( * ) Notice: Subject to any disclaimer, the term of this patent is extended or adjusted under 35 U.S.C. 154(b) by 248 days.

(21) Appl. No.: 14/157,181

(22) Filed: Jan. 16, 2014

(65) Prior Publication Data

US 2015/0198633 A1 Jul. 16, 2015

(51) Int. Cl.
- *G01R 1/073* (2006.01)
- *G01R 1/04* (2006.01)
- *G01R 31/28* (2006.01)

(52) U.S. Cl.
CPC ......... *G01R 1/07378* (2013.01); *G01R 1/0433* (2013.01); *G01R 31/2886* (2013.01)

(58) Field of Classification Search
None
See application file for complete search history.

(56) References Cited

U.S. PATENT DOCUMENTS

| | | | | |
|---|---|---|---|---|
| 6,015,301 A * | 1/2000 | Brodsky | ................ | H01R 12/57 439/331 |
| 6,344,684 B1 * | 2/2002 | Hussain | ............... | G01R 1/0483 257/690 |
| 6,475,011 B1 * | 11/2002 | Sinha | ................... | H01R 43/205 439/330 |
| 6,859,056 B2 * | 2/2005 | Bai | ....................... | G01R 1/0408 324/750.25 |
| 7,684,205 B2 * | 3/2010 | Pai | ....................... | H05K 3/3426 174/250 |
| 7,785,114 B2 * | 8/2010 | Brist | .................... | H05K 7/1069 174/255 |
| 8,536,712 B2 * | 9/2013 | Sasaki | .................... | H01L 25/18 257/686 |
| 8,841,752 B1 * | 9/2014 | Chaware | ........... | H01L 23/49827 257/620 |
| 2003/0129775 A1 * | 7/2003 | Kline | ...................... | H01L 22/20 438/14 |
| 2005/0035440 A1 * | 2/2005 | Mohammed | .......... | H01L 21/563 257/686 |
| 2005/0212540 A1 * | 9/2005 | Nulty | ................. | G01R 1/07314 324/756.03 |
| 2009/0212420 A1 * | 8/2009 | Hedler | .................... | H01L 21/56 257/737 |
| 2011/0217812 A1 * | 9/2011 | Hedler | .................... | H01L 21/56 438/108 |
| 2012/0007211 A1 * | 1/2012 | Aleksov | ................. | H01L 22/32 257/508 |

* cited by examiner

Primary Examiner — Jermele M Hollington
Assistant Examiner — Suresh K Rajaputra
(74) Attorney, Agent, or Firm — Murphy, Bilak & Homiller, PLLC

(57) ABSTRACT

A test interposer includes an interposer layer configured to receive a test socket, and a stiffening layer attached to the interposer layer so that the interposer layer is kept in an unalterable shape.

12 Claims, 4 Drawing Sheets

WIDE INTERPOSER FOR AN ELECTRONIC TESTING SYSTEM

TECHNICAL FIELD

Embodiments described herein generally relate to the field of testing of electronic devices and, more particularly, to a wide test interposer for an electronic testing system and to an electronic testing system.

BACKGROUND

The testing of electronic devices, in particular semiconductor power devices, requires an electronic testing system capable of providing higher voltages and more sensitive current measurements than ever before. As a consequence the usability lifetime of components of the electronic testing system like, for example, a test board, is relatively short especially when testing high power devices involving detecting currents above 10 A. The damages occurring to the test board footprint are mainly caused by a combination of mechanical force and high power electrical testing. The mechanical force comes, for example, directly from a handler plunger mechanism through the test socket that sits firmly on the test board using the plunge to board (PTB) concept. As a consequence the test board must be repaired and ultimately the test board must be periodically replaced.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
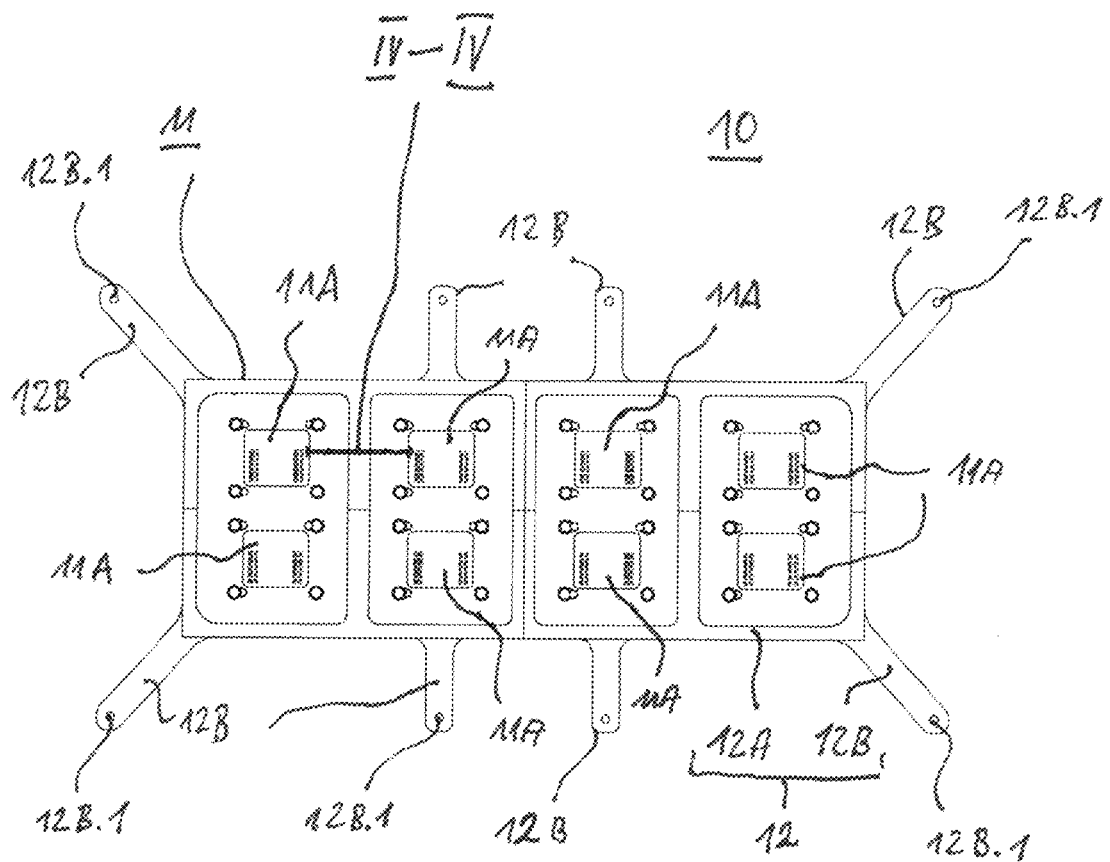
FIG. 1 shows a schematic top view representation of a test interposer comprising eight test sites according to an example.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

FIG. 1 shows a top view representation of a test interposer for an electronic testing system according to a first aspect. The test interposer 10 of FIG. 1 comprises an interposer layer 11 which comprises several test sites 11A, each one of the test sites 11A being configured to receive a test socket (see FIG. 2). The test interposer of FIG. 1 may therefore be also called a wide interposer as it is capable of integrating a plurality of test sites into one contiguous interposer unit. Such a wide interposer can have an arbitrary form and size and it can be as large as the test board. The test interposer 10 of FIG. 1 further comprises a stiffening layer 12 attached to the interposer layer 11 so that the interposer layer 11 is kept in an unalterable shape and the test sites 11A are kept in a fixed position relative to each other.

The terms "interposer", "wide interposer", "test interposer", "interposer layer", and "interposer unit" as used in this application are to be understood as an electrical interface routing between a test socket and a device interface board. The purpose of such an interposer can be to spread a connection to a wider pitch or to reroute a connection to a different connection. The test socket is configured to receive an electronic device to be tested by the electronic testing system.

According to an embodiment of the test interposer 10 of FIG. 1, the stiffener layer 12 comprises a main portion 12A and a plurality of strips 12B outwardly extending from the main portion 12A, each one of the strips 12B comprising at an end of the strip 12B remote from the main portion 12A a through-hole 12B.1 for connecting the strip 12B to a device interface board. The main portion 12A of the connector layer 12 may comprise a rectangular shape.

Figure 2:
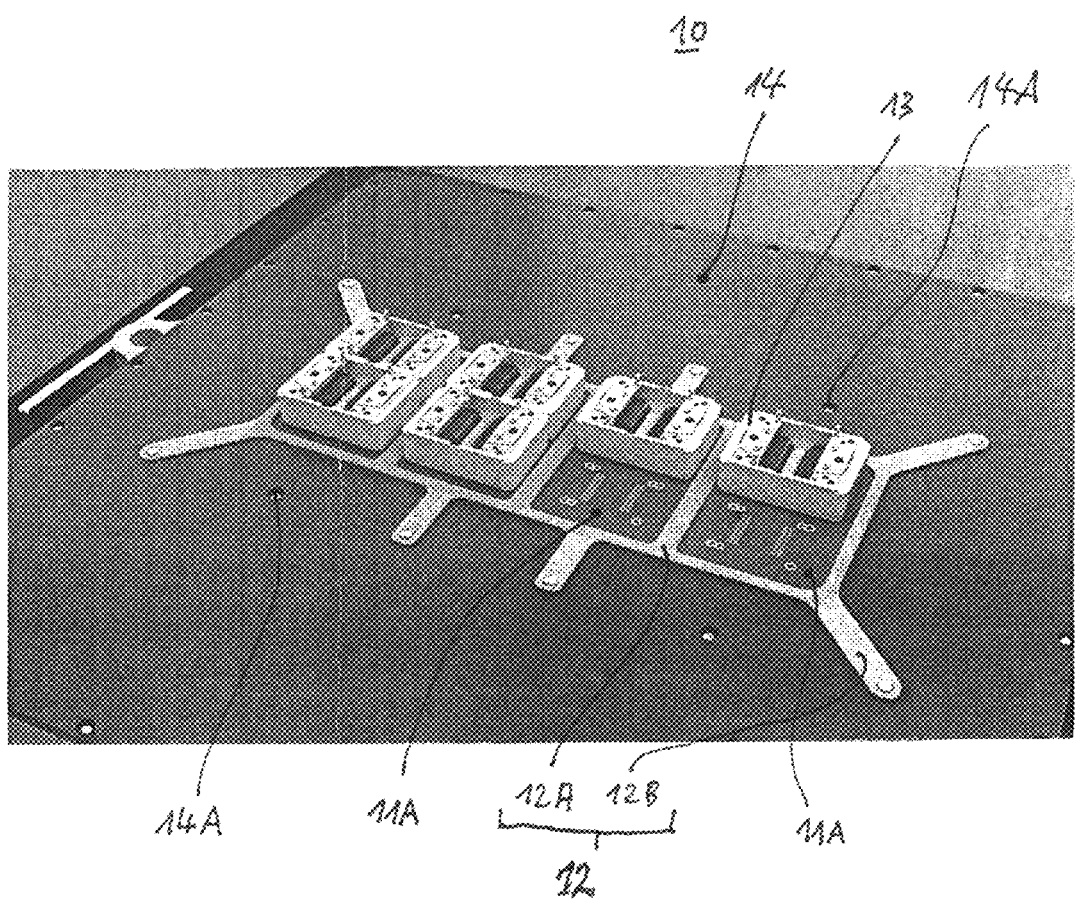
FIG. 2 shows a perspective view of the test interposer of FIG. 1 with several test sockets applied to some of the test sites.

According to an embodiment of the test interposer 10 of FIG. 1, each one of the test sites 11A is configured to receive one test socket as shown in FIGS. 1 and 2.

According to an embodiment of the test interposer 10 of FIG. 1, the test sites 11A are arranged in a regular order like, for example, in the form of a matrix. They can also be arranged side-by-side along a row.

According to an embodiment of the test interposer 10 of FIG. 1, the test sites 11A are formed identical as shown in the example of FIG. 1. It is, however, also possible that the test sites are different in one or more of form, structure, or dimensions. It is also possible that some of the test sites are identical and some others are formed different.

According to an embodiment of the test interposer 10 of FIG. 1, each one of the test sites 11A comprises a rectangular base shape as shown in the example of FIG. 1.

Figure 4:
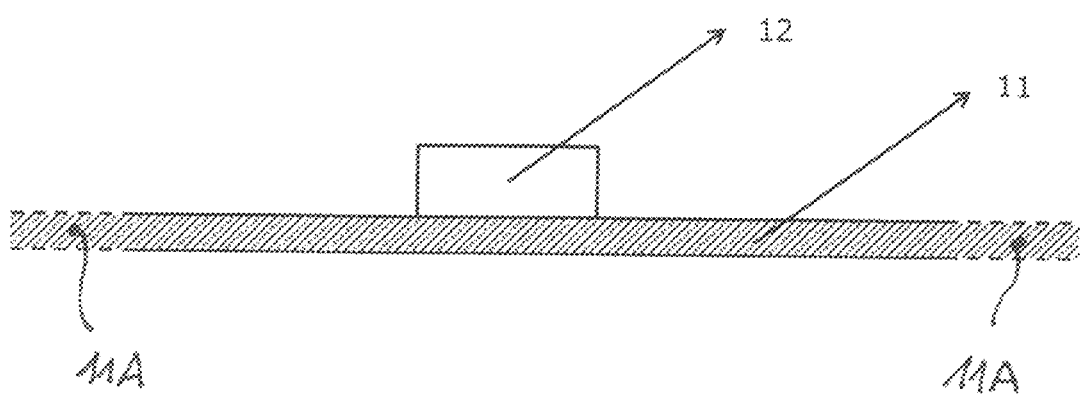
FIG. 4 shows a schematic cross-sectional side view representation of a section of the test interposer 10 of FIG. 1 along line IV-IV.

According to an embodiment of the test interposer 10 of FIG. 1, the stiffener layer 12 is attached to portions of the interposer layer 11 which portions surround each one of the test sites 11A as shown in the example of FIG. 1. In this way it is possible to keep each one of the test sites 11A of the interposer layer 11 in an unalterable shape and to avoid crumpling of the interposer layer 11. It is also possible in this way to hold the test sites 11A in a fixed position relative to each other. FIG. 4 shows a cross-section of the test interposer 10 along line IV-IV of FIG. 1.

According to an embodiment of the test interposer 10 of FIG. 1, the interposer layer 11 comprises a polyimide material, in particular a Kapton-based material.

According to an embodiment of the test interposer 10 of FIG. 1, the interposer layer 11 is comprised of a flat layer comprising a thickness smaller than the thickness of the stiffener layer 12.

According to an embodiment of the test interposer 10 of FIG. 1, the interposer layer 11 is comprised of a flat layer comprising a thickness in a range from 100 µm to 300 µm.

According to an embodiment of the test interposer 10 of FIG. 1, the stiffener layer 12 comprises a thickness in a range from 500 µm to 1200 µm.

According to an embodiment of the test interposer 10 of FIG. 1, the stiffener layer 12 comprises an epoxy resin material, in particular a glass-reinforced epoxy resin material, in particular an FR4 based material.

According to an embodiment of the test interposer 10 of FIG. 1, the stiffener layer 12 is connected with the interposer layer 11 by an adhesive, in particular by a pressure activated adhesive.

According to an embodiment of the test interposer 10 of FIG. 1, the stiffener layer 12 is arranged or configured in such away that it functions so as to avoid crumpling of the interposer layer.

FIG. 2 shows a perspective view of the test interposer 10 of FIG. 1. In addition to the representation of FIG. 1, a number of test sockets 13 is mounted on some of the test sites 11A. Each one of the test sockets 13 is configured to receive an electronic device to be tested. It can also be seen in FIG. 2 that the test interposer 10 is mounted on a device interface board 14 by means of the strips 12B and the through-holes 12B.1. The device interface board 14 is connected to an automated test equipment (not shown) which may be arranged below the device interface board 14. The device interface board 14 may comprise through-holes 14A which may be arranged in such a way that a test interposer 10, having a corresponding layout of through-holes in the strips 12B, may be connected to the device interface board 14 by, for example, inserting screws into the through-holes.

Figure 3:
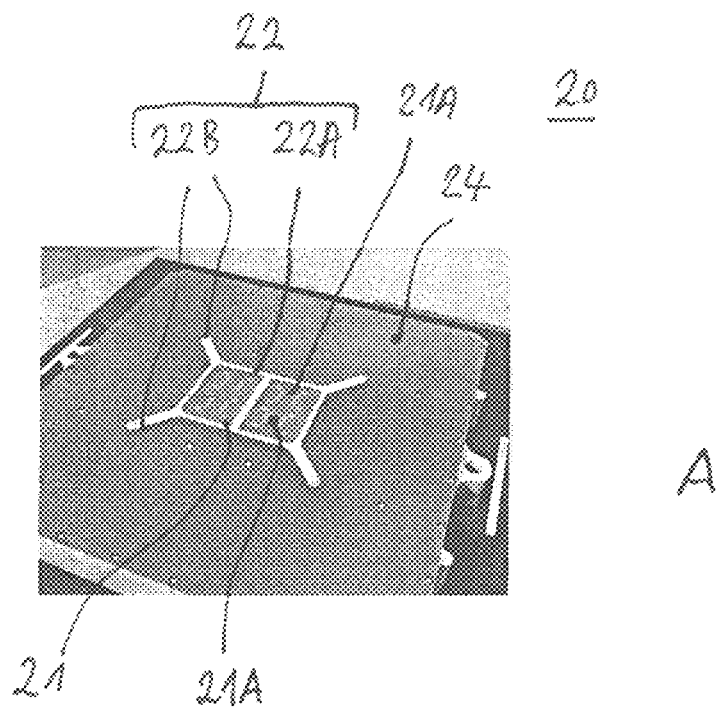
FIG. 3A shows a perspective view of a test interposer comprising four test sites according to an example.
FIG. 3B shows a perspective view of a test interposer comprising four test sites and an asymmetric arrangement of fastening strips according to an example.
Figure 3:
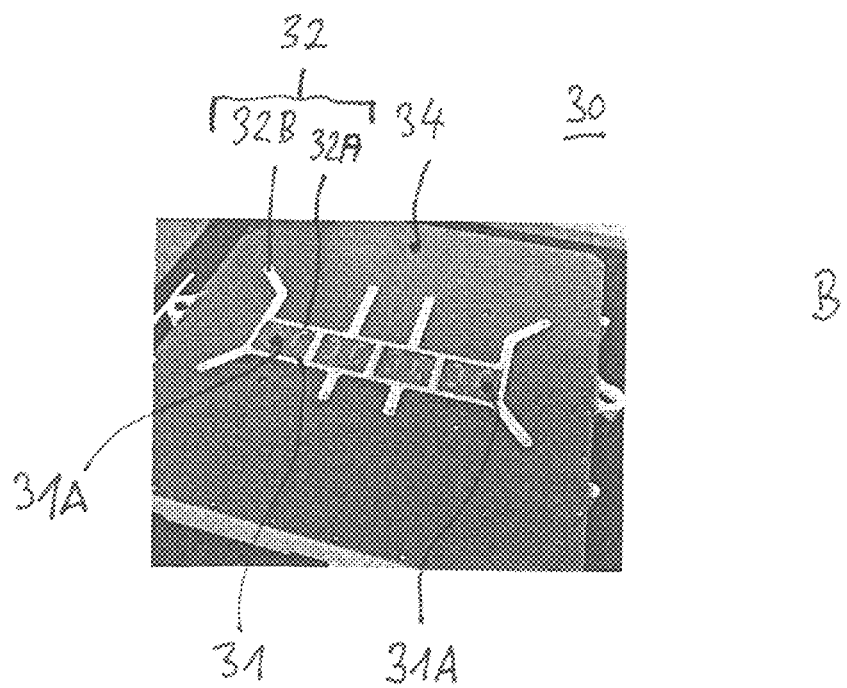

FIG. 3A shows a perspective view of a test interposer 20 according to an example. The test interposer 20 of FIG. 3A comprises an interposer layer 21 comprising 4 test sites 21A arranged in the form of a matrix wherein a stiffener layer 22 is attached to the interposer layer 21. The stiffener layer 22 may be configured in the same way as the stiffener layer 12 of the test interposer 10 of FIG. 1, i.e. comprising a rectangular-shaped main portion 22A and strips 22B outwardly extending from the main portion 22A, the strips 22B comprising through-holes 22B.1 at their respective ends in order to fix the test interposer 20 to a device interface board 24. In the main portion 22A the stiffener layer 22 is attached to portions of the interposer layer 21 which portions surround the test sites 21A.

FIG. 3B shows a perspective view of a test interposer 30 according to an example. The test interposer 30 of FIG. 3B comprises an interposer layer 31 which comprises four test sites 31A arranged side-by-side along a row. The test interposer 30 further comprises a stiffening layer 32 attached to the interposer layer 31. The stiffening layer 32 comprises a rectangular main portion 32A and strips 32B outwardly extending from the main portion 32A. In the main portion 31A the stiffening layer 32 covers portions of the interposer layer 31 which portions surround each one of the test sites 31A. The test interposer 30 may be similar to the test interposer 10 of FIG. 1 besides the fact that the strips 32B are formed in a different way. The embodiment of FIG. 3B makes clear that it is also possible to arrange strips 32B in an asymmetrical way in that strips extending on one side w of the interposer layer 31 may be shorter than strips 32B extending on the other side of the interposer layer 31.

The present disclosure also relates to a test interposer for an electronic testing system according to a second aspect. The test interposer according to the second aspect comprises an interposer layer comprising a plurality of test sites, each one of the test sites being configured to receive a test socket, wherein the test interposer is configured in such a way that the interposer layer is kept in an unalterable shape and the test sites are kept in a fixed position relative to each other.

According to an embodiment of the test interposer of the second aspect, the test sites are arranged in a regular order, in particular in the form of a matrix or in a side-by-side arrangement along a row.

According to an embodiment of the test interposer of the second aspect, the test sites are formed identical.

According to an embodiment of the test interposer of the second aspect, the test interposer further comprises a stiffening layer which is formed contiguous and which is attached to the interposer layer.

According to an embodiment of the test interposer of the second aspect, each one of the test sites comprises a rectangular base shape.

According to an embodiment the stiffening layer is attached to portions of the interposer layer which portions surround each one of the test sites.

According to an embodiment of the test interposer of the second aspect, the stiffening layer comprises a main portion and a plurality of strips outwardly extending from the main portion, each one of the strips comprising at an end of the strip remote from the main portion a through-hole for connecting the strip to a device interface board.

According to an embodiment of the test interposer of the second aspect, each one of the test sites is configured to receive one, two or more than two test sockets.

According to an embodiment of the test interposer of the second aspect, the interposer layer comprises a polyimide material, in particular a Kapton-based material.

According to an embodiment of the test interposer of the second aspect, the interposer layer is comprised of a flat layer comprising a thickness smaller than the thickness of the stiffening layer.

According to an embodiment of the test interposer of the second aspect, the interposer layer is comprised of a flat layer comprising a thickness in a range from 100 µm to 300 µm.

According to an embodiment of the test interposer of the second aspect, the stiffening layer comprises a thickness in a range from 500 µm to 1200 µm.

According to an embodiment of the test interposer of the second aspect, the stiffening layer comprises an epoxy resin material, in particular a glass-reinforced epoxy resin material, in particular an FR4 based material.

According to an embodiment of the test interposer of the second aspect, the stiffening layer is attached to the interposer layer by an adhesive, in particular by a pressure activated adhesive.

FIG. 4 shows a schematic cross-sectional side view representation of a section of the test interposer 10 of FIG. 1 along line IV-IV. FIG. 4 thus shows the connection between the stiffening layer 12 and the interposer layer 11. The section along line IV-IV comprises an edge portion of a first, left-sided test site 11A and an edge portion of a second, right-sided test site 11A. The interposer layer 11 may have the form of a contiguous rectangle depicted as the large rectangle in FIG. 1 and it can be comprised of a layered structure comprising a polyimide layer, in particular a Kapton layer and metallic traces of, for example, copper adhesively attached on both sides of the polyimide layer. The thickness of the interposer layer 11 can be in a range of 100 µm to 300 µm, in particular around 200 µm. The stiffening layer 12 is attached to those portions of the interposer layer 11 which surround each one of the test sites 11A. Along the section IV-IV the stiffening layer 12 is comprised of a strip extending between the left- and right-sided test sites 11A. The thickness of the stiffening layer 12 is preferably in a range of 500 µm to 1200 µm, in particular around 800 µm. The stiffening layer 12 is fixed to the interposer layer 11 by an adhesive material, in particular a pressure activated adhesive material.

According to an embodiment of the test interposer of the first or second aspect, the interposer layer comprises a first main face and a second main face opposite to the first main face and within each one of the test sites a first pad is arranged on the first main face and a second pad arranged on the second main face, and an electrical through-connection is formed in the interposer layer and configured to connect the first and second pads with each other wherein the electrical through-connection is formed by a through-hole and a plated copper layer covering the walls of the through-hole, the plated copper layer comprising a thickness of 40 µm or more.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A test interposer for an electronic testing system, the test interposer comprising:
    an interposer layer configured to receive a test socket; and
    a stiffening layer attached to the interposer layer so that the interposer layer is kept in an unalterable shape, the stiffening layer comprising a main portion and a plurality of strips outwardly extending from the main portion,
    wherein the strips are made of the same material as the main portion,
    wherein each one of the strips comprises at an end of the strip remote from the main portion a through-hole for connecting the strip to a device interface board.

2. The test interposer according to claim 1, wherein the interpose layer comprises a plurality of test sites, wherein each one of the test sites is configured to receive a test socket.

3. The test interposer according to claim 1, wherein the interposer layer comprises a polyimide material.

4. The test interposer according to claim 1, wherein the interposer layer is comprised of a flat layer having a thickness smaller than a thickness of the stiffening layer.

5. The test interposer according to claim 1, wherein the interposer layer is comprised of a flat layer having a thickness in a range from 100 µm to 300 µm.

6. The test interposer according to claim 1, wherein the stiffening layer has a thickness in a range from 500 µm to 1200 µm.

7. The test interposer according to claim 1, wherein the stiffening layer comprises an epoxy resin material.

8. The test interposer according to claim 1, wherein the stiffening layer is connected with the interposer layer by an adhesive.

9. The test interposer according to claim 1, wherein the interposer layer comprises:
    a first main face and a second main face opposite to the first main face;
    a first pad arranged on the first main face and a second pad arranged on the second main face; and
    an electrical through-connection formed in the interposer layer and configured to connect the first and second pads with each other,
    wherein the electrical through-connection is formed by a through-hole and a plated copper layer covering walls of the through-hole, the plated copper layer having a thickness of 40 µm or more.

10. An electronic testing system, comprising:
    a device interface board comprising a main surface;
    a test interposer comprising a plurality of test sites, the test interposer having the form of a flat layer having a main surface and being attached with its main surface onto the main surface of the device interface board; and
    a plurality of test sockets attached to the test sites, each one of the test sockets being configured to receive an electronic device to be tested.

11. The electronic testing system according to claim 10, further comprising:
an automated test equipment, the device interface board being connected to the automated test equipment.

12. The electronic testing system according to claim 10, wherein,
the test interposer comprises outwardly extending strips, each one of the strips comprising a through-hole for connecting the strip to the device interface board, and
the device interface board comprises means for interacting with the through-holes.

* * * * *

UNITED STATES PATENT AND TRADEMARK OFFICE
CERTIFICATE OF CORRECTION

PATENT NO. : 9,459,288 B2
APPLICATION NO. : 14/157181
DATED : October 4, 2016
INVENTOR(S) : Rizza It is certified that error appears in the above-identified patent and that said Letters Patent is hereby corrected as shown below:

In the Claims

Column 6, Line 27 Claim 2, change "interpose layer" to -- interposer layer --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*